United States Patent [19]
Hartig et al.

[11] Patent Number: 5,403,458
[45] Date of Patent: Apr. 4, 1995

[54] SPUTTER-COATING TARGET AND METHOD OF USE

[75] Inventors: Klaus W. Hartig, Brighton; Philip J. Lingle, Lambertville, both of Mich.

[73] Assignee: Guardian Industries Corp., Northville, Mich.

[21] Appl. No.: 102,585

[22] Filed: Aug. 5, 1993

[51] Int. Cl.⁶ ............................................. C23C 14/34
[52] U.S. Cl. ..................... 204/192.15; 204/192.16; 204/192.23; 204/192.26; 204/298.12; 204/298.13; 204/298.14
[58] Field of Search ............ 204/298.12, 298.13, 204/192.15, 192.16, 192.17, 192.18, 192.21, 192.22, 192.23, 192.25, 192.26, 192.27, 192.28, 192.29, 298.06, 298.14, 298.21, 298.22

[56] References Cited

U.S. PATENT DOCUMENTS

| | | | |
|---|---|---|---|
| 3,477,935 | 11/1969 | Hall | 204/192.23 |
| 3,563,873 | 2/1971 | Beyer | 204/192.23 |
| 3,763,026 | 10/1973 | Cordes | 204/192.23 |
| 3,916,075 | 10/1975 | Dimigen et al. | 204/192.22 |
| 4,131,533 | 12/1978 | Bialko et al. | 204/298.14 |
| 4,166,018 | 8/1979 | Chapin | 204/192.12 |
| 4,478,700 | 10/1984 | Criss | 204/192.15 |
| 4,510,178 | 4/1985 | Paulson et al. | 204/192.22 |
| 4,513,905 | 4/1985 | Nowicki et al. | 204/192.15 |
| 4,680,742 | 7/1987 | Yamada et al. | 204/192.23 |
| 4,717,462 | 1/1988 | Homma et al. | 204/298.06 |
| 4,769,291 | 9/1988 | Belkind et al. | 204/192.23 |
| 4,849,079 | 7/1989 | Cuomo et al. | 204/192.17 |
| 4,849,081 | 7/1989 | Ross | 204/192.23 |
| 4,931,158 | 7/1990 | Bunshah et al. | 204/298.11 |
| 4,948,482 | 8/1990 | Kobayashi et al. | 204/192.23 |
| 4,954,232 | 9/1990 | Yamada et al. | 204/192.23 |
| 4,966,676 | 10/1990 | Fukasawa et al. | 204/298.12 |
| 5,047,131 | 9/1991 | Wolfe et al. | 204/192.23 |
| 5,062,937 | 11/1991 | Komuro | 204/192.15 |
| 5,108,846 | 2/1992 | Steininger | 204/192.16 |
| 5,141,613 | 8/1992 | Adoncecchi et al. | 204/192.1 |
| 5,171,411 | 12/1992 | Hillendahl et al. | 204/298.22 |
| 5,188,887 | 2/1993 | Lingle et al. | 428/216 |

FOREIGN PATENT DOCUMENTS

3-177568  8/1991  Japan ............................. 204/298.13

OTHER PUBLICATIONS

"Performance And Sputtering Criteria Of Modern Architectural Glass Coatings:", SPIE vol. 325, Optical Thin Films (1982).

"Production Techniques For High Volume Sputtered Films", SPIE vol. 325, Optical Thin Films (1982).

*Primary Examiner*—R. Bruce Breneman
*Assistant Examiner*—Rodney G. McDonald
*Attorney, Agent, or Firm*—Myers, Liniak & Berenato

[57] ABSTRACT

A sputter coating target which alleviates the need for anode reconditioning due to a buildup of a nonconductive coating comprises a coating component which itself or its reactive product is substantially electrically nonconductive and a dopant component which itself or its reactive product is substantially electrically conductive.

23 Claims, 3 Drawing Sheets

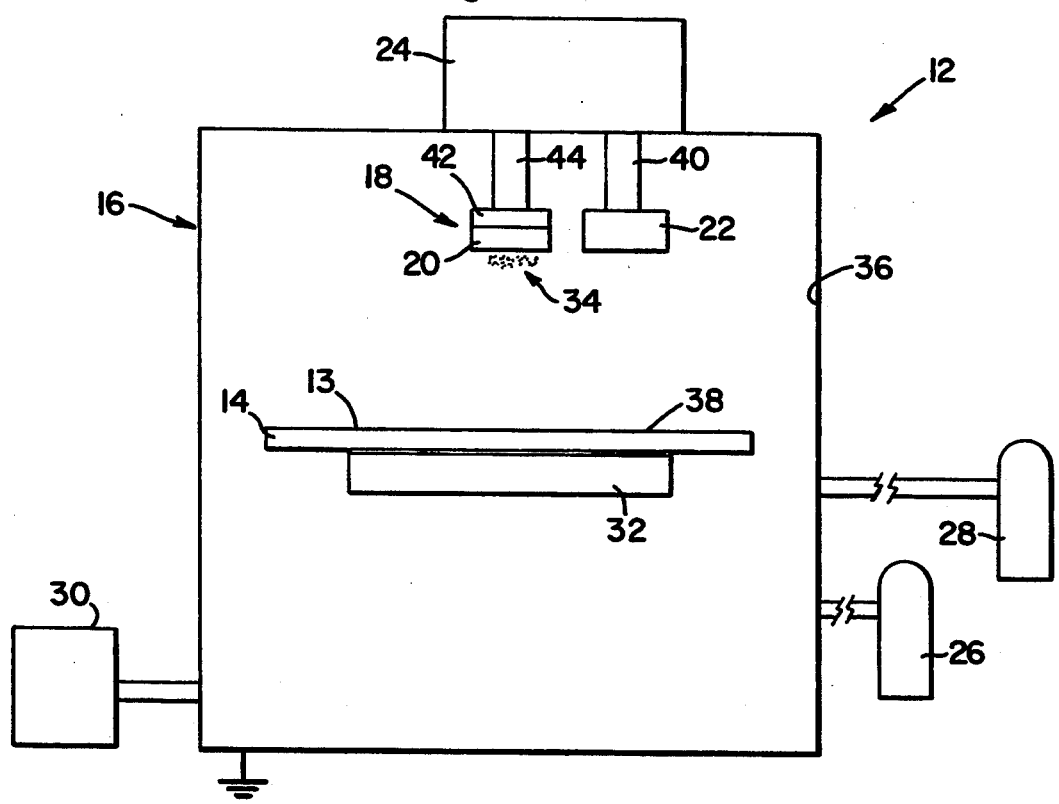
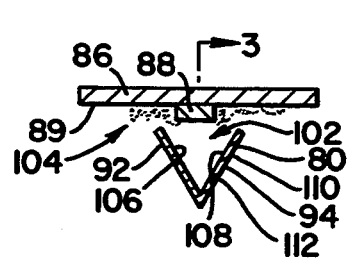
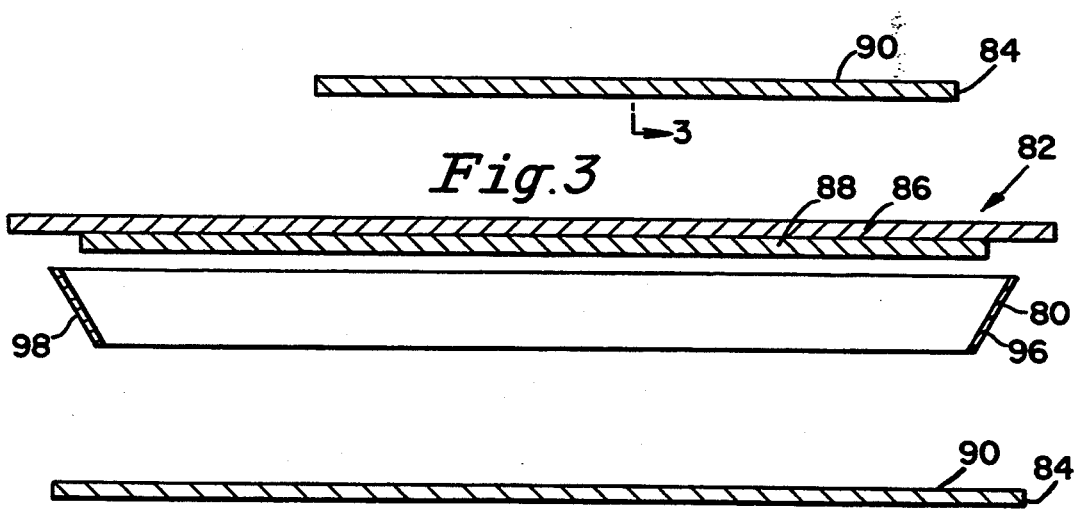

SPUTTER-COATING TARGET AND METHOD OF USE

FIELD OF THE INVENTION

This invention relates to targets for sputter coating a material onto a substrate and to a method of using the target. More particularly, this invention relates to targets containing special dopant materials and to methods of using such targets for reducing process downtime required for anode reconditioning.

BACKGROUND OF THE INVENTION

As is well known in the fields of automotive and architectural glass, multi-layered coating systems play a vital role in providing desirable characteristics such as transmittance, emissivity, reflectivity, durability, color, and chemical resistance. Such coating systems may be conventionally created by the well known commercial process known as sputter coating whereby a variety of different materials including metals and non-metals in pure, oxide or nitride form are applied to a glass substrate. An example of one such layer used in coating systems is silicon nitride ($Si_3N_4$). Silicon nitride is desirable as a coating for glass because it is durable and forms a transparent protective layer. The layer or layers of silicon nitride may be applied by sputter coating silicon from a silicon cathode target in the presence of nitrogen gas.

Sputter coating is an electric discharge process, conducted in a vacuum chamber and in the presence of one or more gases. The equipment employed normally includes a vacuum chamber, a power source, an anode, and one or more specially prepared cathode targets covered with the material used to create a layer in the coating system. This equipment is expensive, and techniques for producing sputter coated articles are complex, time consuming and must be carried out with great precision. Consequently, like many other industrial processes, once the process is started, it is desirable to allow the process to continue for as long a period of time as possible and to produce as much end product as possible.

When an electric potential is applied to the cathode target, the background gas forms a plasma that bombards the target causing particles of the coating material to be liberated. The liberated coating material then adheres to the substrate and other exposed surfaces within the vacuum chamber, such as the chamber walls and the anode. When conducted in the presence of a reactive gas, a reactive product of the coating material is deposited on the substrate, i.e. the coating layer is the product of the coating material and the reactive gas.

In commercial sputter-coating systems such as those produced by Airco Corporation, a cathode target typically has sufficient coating material on it to coat glass substrates uninterruptedly for up to seven to fourteen days. Depending on process parameters, some systems are designed to continue for up to as much as seventy days. Unfortunately, while a single cathode target may be designed with sufficient coating material so as to be capable of coating thousands of linear feet of glass, present sputter coating systems rarely continue uninterrupted for even three days. The reason for this is as follows:

When producing a coating which is conductive, such as a metal or certain reactive products of that metal, the sputter coating process can generally continue until the cathode target is exhausted. However, when, as often occurs, the coating material or its reactive product which must be used is an insulator, a semiconductor, or is otherwise a substantially electrically nonconductive material, a build-up of the nonconducting material on the anode causes a progressive slow-down and eventual stoppage of the coating process. In short, such a coating on the anode inhibits and eventually prevents charge carriers from flowing from the anode to the cathode, thus at first reducing and eventually virtually stopping the sputtering process. Exemplary of such nonconducting materials are the often highly desirable coating components of silicon (Si) and aluminum (Al) including their nitrides. In this respect silicon targets are often doped with about 5% aluminum, but as such merely manifest the same problem as targets made up only of one or the other of these two desirable materials.

In addition to process downtime, the build-up of substantially electrically nonconductive coatings on the anode of a sputter coating device may have several other adverse affects on the coating process and on the coating formed on the substrate. Nonuniformities may occur in the coating due to changes in the size of the conductive area of the anode. Furthermore, large pieces of coating material may drop off the cathode target and onto the substrate because of arcing at the cathode target, and flakes of material may fall off the anode because of the poor adhesion of the coating to the anode. Poor adhesion is characteristic of a thick build-up of a substantially electrically nonconductive coating.

When the anode becomes coated with an insulative material blocking the flow of charge carriers or creating coating nonuniformities, the coating process must be halted in order to clean or change the anode. This reconditioning includes venting the chamber, careful cleaning and reevacuating the chamber. In typical commercial sputter-coating techniques, such as for producing layer systems which include one or more layers of nonconductive silicon nitride, the process may often have to be stopped for reconditioning the anode after as little as two days of continuous use. Such reconditioning then often requires about 24 hours to complete. Thus, downtime may represent up to a third of the total available time for production, a very large and undesirable proportion of the available production time.

U.S. Pat. No. 4,478,700 to Criss proposes a solution to this problem by using multiple cathodes with each anode. While monitoring the bias voltage on the anode, a desired coating is sputtered onto the substrate and the anode until the bias voltage reaches a level at which coating efficiencies become unacceptable. At that time, a new cathode is introduced which sputters a different, but now conductive coating onto the anode and the substrate as well. This conductive coating is designed so as to serve no other useful purpose in the layering system. The conductive layer formed on the anode thereby serves to lower the bias voltage of the anode, increasing process efficiency without completely halting the sputtering process. In such a process, however, there is required a plurality of cathodes and a mechanism, such as a rotating table system, to present the various cathodes to the coating process. Furthermore, Criss produces alternating layers of the desired coating and of the conductive material on the substrate. This has the potential of eventually building up to unacceptable thicknesses.

Other solutions which have been proposed to solve the problem of non-conductive coatings on the anode include rotary anodes, anodes with very large surface areas, and finned anode configurations. In another system, two cathode targets are employed, each of which is capable of acting as both a cathode and an anode. The system is periodically reversed so that a coating built-up on the anode is sputtered off when operated as a cathode. In a hybrid of this latter system, two cathode targets are used and the sputter magnets are alternated between them so as to alternatively apply a nonconductive and a conductive layer on the anode.

The above known attempts to solve this anode coating problem present their own drawbacks in terms of expense, complexity and, in some instances, even commercial feasibility. Delicately dimensioned fin geometry, for example, is required in one of the above solutions, complex alternating electrical controls in another, and excessively large anodes in another.

In view of the above, it is apparent that there exists a need in the art for an improved sputter-coating target and method of using such target which overcomes the above-described problems as well as other problems which will become more apparent to the skilled artisan once given the following disclosure.

SUMMARY OF THE INVENTION

Generally speaking, this invention fulfills the above-described needs in the art by providing a cathode target for producing a coating having preselected characteristics on a substrate by the sputter-coating process in a vacuum chamber which also has an anode therein to which the coating is also applied during the sputter-coating process, the cathode target comprising a coating component which by itself or its reactive product is substantially electrically nonconductive and a dopant component which by itself or its reactive product is substantially electrically conductive, the dopant component being present in an amount such that any layer of said coating formed on the anode will include said coating component and a sufficient amount of said dopant component to render said coating substantially electrically conductive; said coating so formed on said substrate having its preselected characteristics.

The cathode targets of this invention preferably include minor amounts by weight of the dopant component (e.g. less than about 50% by weight of the dopant component). Preferably the target includes from about 0.1% by weight to about 20% by weight of this dopant element.

While this invention contemplates within its scope a wide number of coating components which by themselves or their reaction products are nonconductive, in particularly preferred embodiments, the coating component is silicon. Likewise, a wide number of dopants are contemplated so long as they or their reaction products are conductive and may be assimilated into the layer being formed without undue adverse effects. Preferably, the dopant component is chromium, hafnium, titanium, zirconium or mixtures or alloys thereof.

This invention further fulfills the above-described needs in the art by providing a method for producing a coating having preselected characteristics on a substrate by the sputter-coating process in a vacuum chamber which includes at least one cathode target and an anode which is coated during said process, the steps comprising: providing a cathode target which includes a coating component which itself or its reactive product is substantially electrically nonconductive and a dopant component which itself or its reactive product is substantially electrically conductive and wherein the dopant component is in an amount such that any coating formed on the anode will include a sufficient amount of said dopant component to render said coating substantially electrically conductive, applying an electric potential to the cathode target thereby causing molecules of the coating and dopant components to be dislodged from the cathode target and deposited on said substrate and said anode as a single layer, whereby said anode remains conductive for a substantial length of time and said coating on said substrate has its preselected characteristics.

This invention will now be described with reference to certain specific embodiments thereof as illustrated in the accompanying drawings wherein:

IN THE DRAWINGS

FIG. 1 is a schematic illustration of a typical vacuum sputter coating device.

FIG. 2 is a fragmentary cross-sectional side elevational view of a typical vacuum sputter-coating apparatus utilizing one type of a cathode target as contemplated by the present invention.

FIG. 3 is a fragmentary cross-sectional end elevational view of the vacuum sputter coating apparatus of FIG. 2 taken along the line 3—3.

DESCRIPTION OF CERTAIN EMBODIMENTS

Figure 4C:
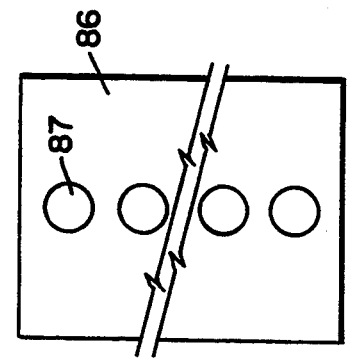
FIG. 4c is a plan view of another type of cathode target as contemplated by the present invention.

It is to be understood that this invention is applicable to sputter-coating processes generally wherein there is employed an anode and cathode arrangement in which the anode becomes coated during sputter coating with what, but for this invention, would otherwise be an adverse nonconductive coating. The following examples are presented as illustrative of the generic nature of this invention rather than as a limitation upon it.

With reference now to FIG. 1, there is illustrated in generic schematic form a typical sputter coating apparatus 12 utilized to produce coatings on, for example, electrical devices such as thin film resistors and transistors, electrical circuits such as integrated circuits and matrix arrays for systems such as liquid crystal display devices, or solar management coatings on architectural and automotive glass substrates. Sputter coating apparatus 12 for applying coating 13 to substrate 14 typically includes vacuum chamber 16, one or more cathodes or targets 18 including a material 20 to form coating 13, one or more anodes 22, control electronics 24, a source of background gas 26, a source of reactive gas 28, and a vacuum pump 30. Substrate 14 is supported within chamber 16 by support 32 which may be either a stationary support or a transport mechanism (e.g. conveyor) for moving substrate 14 through chamber 16.

Many commercial products, including architectural and automotive glass require a layer system including multiple layers of sputtered coatings comprised of one or more elements or reactive products of those elements. Therefore, it is sometimes necessary, after applying a first coating layer of the layer system, to introduce a new cathode target into chamber 16 or to pass substrate 20 through a series of sputter coating chambers which may or may not be interconnected. In sputter-coaters such as those sold by Airco Corp., a plurality of sequential chambers (or zones) are each provided with one or more targets and the ability to separately control the gas environment and parameters therein, thereby to sequentially lay down upon a substrate the desired layer system by progressing the substrate through the sequential chambers at a given speed.

In general, the operation of a typical sputter coating apparatus 12 to produce a coating on substrate 14 is as follows. Each chamber in the sequence, such as chamber 16 is evacuated to a desired vacuum pressure to remove undesirable impurities such as water vapor and atmospheric air. A desired flow of the selected background gas 26 and/or reactive gas 28 (e.g. $N_2$, Ar, $O_2$, etc.) is introduced into chamber 16. A high negative electrical potential is applied to cathode target 18 thereby ionizing the gas(es) and forming plasma 34. A relatively small negative potential is applied to anode 22. Chamber walls 36 are maintained at ground. Plasma 34 bombards cathode target 18 thereby causing particles of coating material 20 to be liberated or sputtered and subsequently to coat exposed surface(s) 38 of substrate 14. In addition, the liberated particles of material 20 will coat chamber walls 36 and anode 22. Magnets, not shown for convenience, are included within many typical cathode targets 18 to confine plasma 34 to a small area near the surface of cathode target 18 commonly known as a "racetrack".

Anode 22 is, typically, a bar, rod or plate of a conductive material such as stainless steel extending parallel to cathode target 18 and preferably extending at least the length of cathode target 18. Anode 22 is the positive terminal of an electric circuit and is operatively connected to controls 24 and cathode target 18. Anode 22 is supported within chamber 16 by electrically insulative support members 40. Support members 40 ensure that anode 22 and chamber walls 36 are maintained at different electrical potentials. Typically, one anode 22 is present for every cathode 18.

Cathode target 18 includes material 20 which is adhered to a conductive backing member 42 and is the negative terminal of the electrical circuit of which anode 22 is a part. Cathode target 18 may be planar, square, round, or cylindrical and may, in certain embodiments, rotate. Cathode target 18 is supported within chamber 16 by support member 44 and is operatively connected to control electronics 24 through chamber wall 36. Backing member 42 is typically made of stainless steel.

Generally, cathode targets are produced by several well known methods including extruding, casting, liquid metal spraying, hot isostatic spraying, electroplating or plasma spraying. The method of producing a cathode target chosen is dependent upon several factors including the configuration and characteristics desired of a particular cathode target, the type and characteristics of the material(s) making up the cathode target and, of course, cost. Of the techniques listed, plasma spraying is an established technique which produces a substantially uniform coating material composition at a modest cost. In one plasma spray method, powder is fed into a spray gun, where it is melted into droplets and imparts a high velocity in a region of ionized gas. The droplets impact on the cathode target backing member, solidify, and build up a coating. Plasma spraying produces a covering of coating material 20 which is a substantially homogeneous mixture of known materials.

Cathode target 18 of the present invention includes a layer of material 20 comprised of at least two components; a coating component and a dopant component as hereinbefore described and as further described below. Material 20 may be a substantially uniform or homogeneous mixture of the two components in order to carry out the objectives of the present invention or, as later described may simply be made up of the two components in unmixed but adjacently located form. The precise make-up of material 20 and choice of the two components will be determined by the desired characteristics of layer 13 coupled with the need to create the desired amount of conductivity in the coating formed on the anode to increase productivity.

With these objectives in mind, the coating component of material 20 is a material which by itself or its reactive product produces alone or as part of a multi-layer system result in certain desirable preselected characteristics being accorded the final, coated glass article such as solar management properties, chemical resistance and durability. In addition, this coating component is a material which itself or its reactive product is substantially electrically nonconductive, such that if deposited on the anode by itself, without the dopant component or its reaction product also being deposited on the anode, would give rise to the above-described anode coating problem known in the art. As aforesaid, such coating components are well known, examples of which include Si, aluminum, their alloys, and mixtures thereof. Other nonconductive coating components include, for example, the nitrides or oxides of: aluminum, bismuth, chromium, boron, germanium, tin, titanium, tungsten, vanadium, zinc, zirconium, and certain combinations or alloys thereof.

In certain preferred embodiments of the present invention, the coating component in the cathode target is silicon and the sputter-coating process is conducted in an $N_2$ containing gas to produce at least one layer of $Si_3N_4$ or in an $O_2$ containing gas to produce at least one layer of $SiO_2$. Silicon is itself a substantially electrically nonconductive element. Both silicon oxide ($SiO_2$) and silicon nitride ($Si_3N_4$) are also substantially electrically nonconductive. Silicon nitride layers have been found to be highly desirable for architectural and automotive glass purposes because they form durable, protective, and transparent layers.

The dopant component used to overcome the aforesaid problem is a material which by itself or its reactive product forms a substantially electrically conductive layer. It is homogeneously mixed or otherwise provided along with the coating component to form material 20, in an amount sufficient to render the ultimate coating formed on the anode substantially conductive, thus prolonging production time and minimizing the shutdown time due to the need for anode reconditioning.

In addition, since the dopant component, or its reactive product, will form a portion of layer 13 (along with the coating component or its reactive product) the dopant component or its reactive product in the amount employed, must be of such a nature so as not to substantially interfere with the desired, preselected characteristics of the layer system created on the substrate.

Materials satisfying the above requirements for the dopant component as contemplated by this invention include the noble metals, highly oxidation resistant metals, and elements which form conductive oxides and conductive nitrides. Metals such as silver, gold and platinum are highly unreactive, i.e. will not, typically, form reaction products, but are themselves substantially electrically conductive,. Metals such as nickel and palladium are also substantially electrically conductive by themselves but are highly oxidation resistant. Indium and tin may also be employed as the dopant component of the cathode target of this invention as the oxides of these elements, including indium tin oxide (ITO) and indium oxide ($In_2O_3$), are substantially electrically conductive. All of these materials have at times, as well, been known to be useful in sputter-coating systems, and thus do not, when properly chosen for a particular system, adversely affect the overall desired characteristics of the layer system as a whole which is to be formed. Indeed, in some instances, such a dopant may actually enhance the characteristics achieved in the layer, as well as in the overall coating if properly chosen.

When silicon nitride is the coating component, and the coated glass article is to be used for architectural and automotive glass purposes, the dopant element employed in particularly preferred embodiments of this invention includes titanium, zirconium, chromium, hafnium and mixtures or alloys thereof. One reason these elements are preferred is because their nitrides are substantially electrically conductive. In addition, the durability, transparency and other solar management characteristics sought from silicon nitride layers in many layer systems are not adversely affected or interfered with when the appropriate amount of these dopant components are admixed with the silicon to form the target material.

When preparing cathode targets as contemplated by this invention, the required relative proportions of the coating and dopant components are dependent upon two primary factors First the amount of the dopant present in or on the cathode target must be sufficient such that the coating formed on the anode including the coating component is substantially electrically conductive. Second, the amount of the dopant present in or on the cathode must be such that the characteristics desired in the layer being formed as well as the overall layer system created on the substrate are not substantially adversely affected or interfered with by the presence of the dopant component or its reactive product in the coating layer. In this regard, it is known that a coating having a resistivity of at least about 1 megohm per square (when measured as a thin film on the anode) is adequately electrically conductive to prevent the nonuniformities and instabilities referred to above which otherwise would require anode reconditioning. Of course, those skilled in the art will recognize that lower resistivities of, for example, 1000 ohms per square or even 100 ohms per square, provide better electrical conductivity. However, it must be remembered that as the resistivity and therefore the electrical conductivity are improved, due to an increase in the relative proportion of the dopant component, the desired characteristics of the coating may be adversely affected or interfered with. Therefore, it is usually desired that a cathode target of the present invention include, as a percentage of the total target weight, only minor amounts, i.e. less than about 50% by weight, but at least about 0.1% by weight of the dopant component. In preferred embodiments, a cathode target according to the present invention includes between about 0.1% by weight to about 20% by weight of the dopant. The balance of the cathode target composition, by weight, is the coating component alone or with small amounts of other known constituents in unusual situations.

While the purpose and scope of this invention may be carried out in and with a variety of sputter-coating devices, two representative devices are illustrated in the accompanying drawings. For example, in FIGS. 2–4 anode 80 of a first sputter-coating apparatus is associated with a cathode target 82 of the present invention to coat a substrate 84. It is to be remembered, of course, that a sputter coating apparatus must also include an appropriate vacuum chamber, control electronics, vacuum pump, gas sources, and substrate support. These elements, however, have not been shown in FIGS. 2 and 3 for convenience.

Figure 4B:
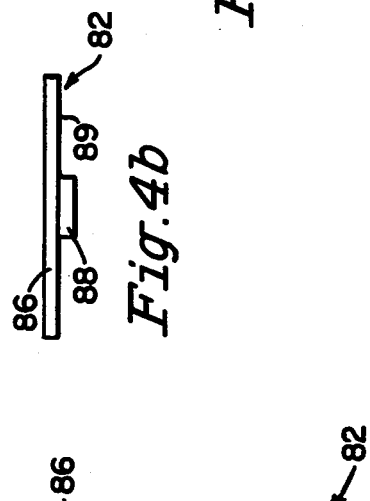
FIGS. 4a and 4b are a plan view and end view respectively of a planar type cathode target as contemplated by the present invention.
Figure 4A:
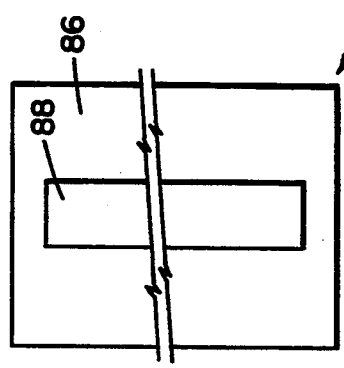

Cathode target 82, as further illustrated in FIG. 4a and 4b, includes two distinct but adjacently located portions, one of coating material 86 and the other of dopant 88. Dopant 88 is physically smaller than coating material 86, particularly in the transverse direction. Dopant 88 is preferably positioned centrally with respect to coating material 86. While dopant 88 is shown in FIGS. 4a and 4b as being secured to the surface of a substantially planar block of coating material 86, coating material 86 could also include a recessed area or a hole designed to accept dopant 88. Alternatively, cathode target 82 may be as depicted in FIG. 4c wherein dopant 87 is in the form of discs or wafers located on or in a planar block of coating material 86.

As best shown in FIGS. 2 and 3, cathode target 82 is positioned so that surface 89 to which dopant 88 is secured faces anode 80 and substrate 84. The relative proportions of the exposed surfaces of coating material 86 and dopant 88 represent the desired proportions of those materials required to carry out the purposes of this invention; namely, to produce a substantially conductive coating on anode 80 while producing coating 90 having desired characteristics on substrate 84.

In the apparatus depicted in FIGS. 2 and 3, a specially constructed anode 80 is utilized. Anode 80 blocks the line-of-sight path between dopant 88 and substrate 84. As best illustrated in FIGS. 2 and 3, anode 80 is V-shaped with side members 92 and 94, and end members 96 and 98. Anode 80 is positioned with opening 102 facing cathode target 82. In this manner, after evacuating the chamber and introducing the required amounts of reactive and background gases and applying appropriate potentials to the anode and cathode to produce plasma 104, substantially all liberated particles of dopant 88 are captured within anode 80 and do not impinge on substrate 84. Any adverse effects from dopant 88 are thus minimized. Inner surface 106 of anode 80, on the other hand, is coated with a substantially electrically conductive coating 108 consisting primarily of dopant 88 or a substantially electrically conductive coating 108 consisting of a reactive product of dopant 88 and only a minor amount, if any, of nonconductive coating material 86 or its nonconductive reactive product. Conductive coating 108 reduces or eliminates the need for halting the coating process to recondition anode 80. Furthermore, the coating applied to substrate 84 is a uniform coating comprised primarily of coating material 86 or its reactive product with only a minimal amount, if any, of dopant or its reactive product, extant.

While anode 80 could be U-shaped or box-shaped, the V-shape is advantageous over these other shapes. The V-shape is essentially invisible because it allows liberated particles of coating material 86 to flow past exterior surfaces 110. This substantially reduces the build-up of nonconductive material 112 on exterior surfaces 110, when compared to a U-shape or box-like anode, thereby reducing the possibility of flakes of nonconductive material 112 falling onto substrate 84.

Figure 5:
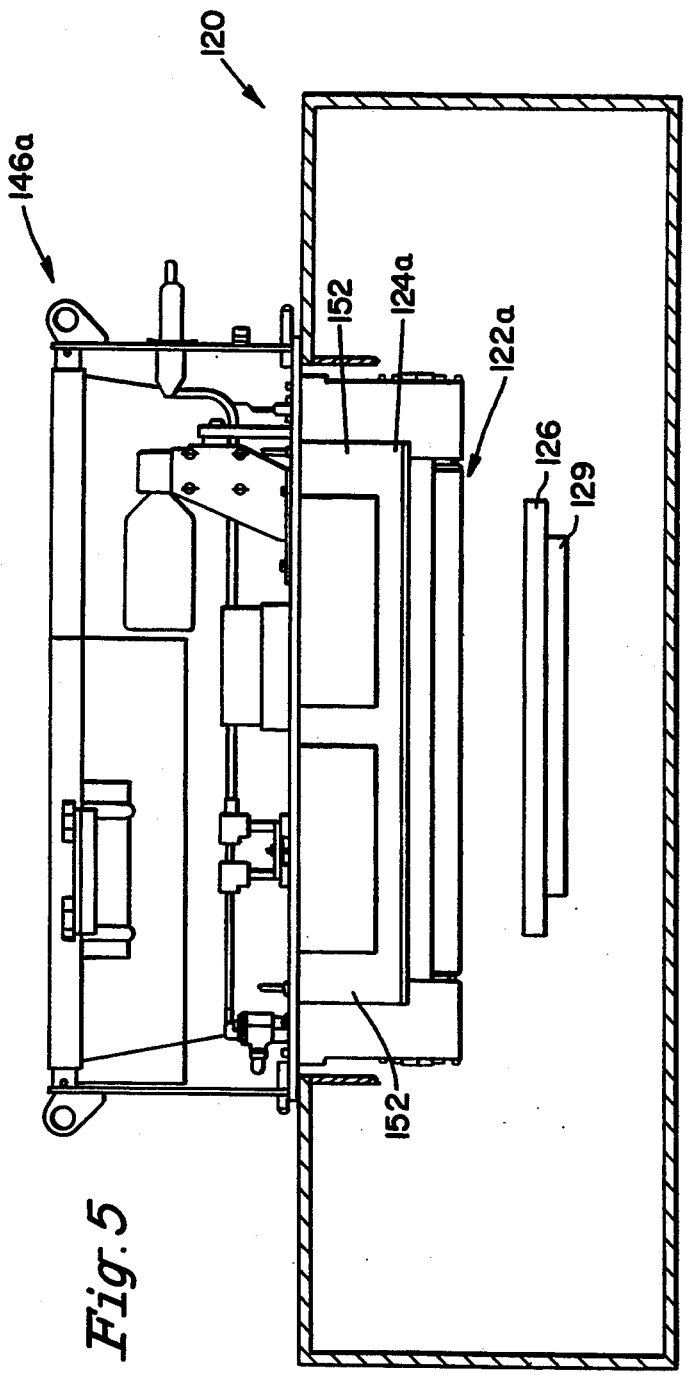
FIG. 5 is a fragmentary cross-sectional side elevational view of another typical vacuum sputter coating device.
Figure 6:
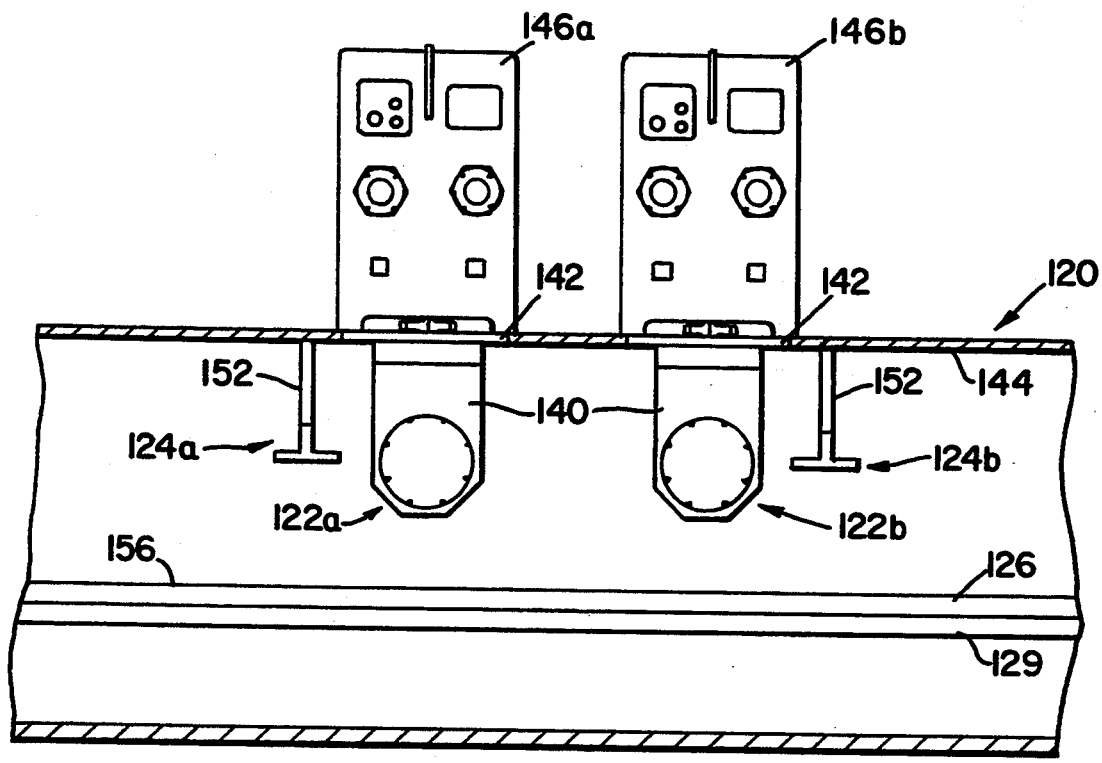
FIG. 6 is a fragmentary cross-sectional end elevational view of the vacuum sputter coating device illustrated in FIG. 5.

A preferred sputter coating apparatus for purposes of this invention is a C-MAG ™ Rotatable Magnetron G-49 machine available from Airco Coating Technology. The G-49 machine is particularly preferred for coating large sheets of glass for architectural and automotive uses. The G-49 machine is a multi-zone sputter coating apparatus and includes a series of interconnected vacuum chambers. Within each of the chambers, a different layer of a multilayered coating system is applied to sheets of glass as they are continuously conveyed through the chambers. A single bay of the G-49 machine is illustrated in FIGS. 5 and 6 and includes, mounted in a vacuum chamber 120, a plurality of C-MAG ™ cylindrical rotatable DC magnetron cathode targets 122a and 122b, and an equal number of anodes 124a and 124b. Cathode targets 122a and 122b and anodes 124a and 124b are aligned in a plane parallel to the direction of movement of substrate 126 and extend transverse to the direction of movement of substrate 126, as best shown in FIG. 6. Substrate 126, such as a sheet of conventional float glass, is passed continuously through chamber 120 in the direction of the arrow on conveyor 129.

Figure 7:
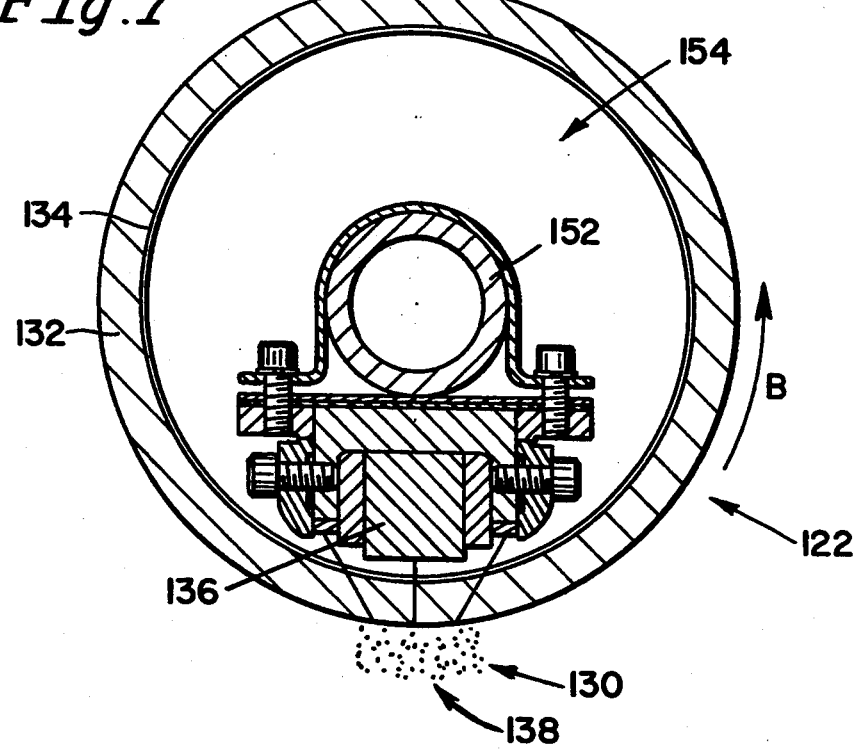
FIG. 7 is a cross-sectional view of a rotary type of cathode target as contemplated by the present invention and as used in the device of FIGS. 5–6.

As shown best in FIG. 7, each C-MAG ™ magnetron cathode target 122 is a hollow cylindrical tube which rotates, as indicated by the arrow B, through a stationary plasma 130 created by ionization of the inert background gas when a potential is applied to cathode target 122. The cylindrical geometry of cathode target 122 promotes substantially uniform erosion of the surface of cathode target 122. Cathode targets 122 of the G-49 machine are approximately 114 inches long thereby providing full coverage over a substrate 126, such as a 100 inch wide sheet of a glass.

Cathode targets 122 includes coating material 132 secured to backing tube 134. Cathode targets 122, preferably produced by plasma spraying, typically include enough material 132 to continuously coat sheets of glass for up to seven to fourteen days. Under certain process conditions, enough coating material 132 may be present for coating to continue for up to sixty days.

Suspended within cathode targets 122 is an array of magnets 136 for substantially confining plasma 130 to an area 138 proximate the surface of cathode targets 122. Area 138 is commonly referred to as a "racetrack". Cooling water circulates through tube 150 and annular space 154 for cooling magnets 136 and cathode targets 122. Cathode targets 122 and magnet array 136 are supported on two ends by aluminum support structures 140. Support structures 140 include bearings and vacuum seals, not shown, allowing cathode targets 122 to rotate. Support structures 140 are mounted on a structural steel plate 142 which mounts to vacuum chamber wall 144. Cathode targets 122 and support structures 140 protrude into vacuum chamber 120 while control electronics 146a, b remain outside chamber 120. Control electronics 146a, b includes a power source and target rotation motor.

Two cathode targets 122a and 122b are employed in chamber 120 for the increased sputtering rate attainable therewith. Each cathode target 122a and 122b is associated with corresponding anode 124a and 124b and a separate set of control electronics 146a and 146b. Each cathode target 122 is typically operated at the same power so that the same amount of coating is applied from each cathode target. This helps ensure that known thicknesses of coating are built-up and that cathode target consumption occurs at the same or similar rate.

In accordance with the practice of this invention, then, cathode targets 122 a, b are provided with a homogeneous admixture of a coating material and dopant, in the requisite proportion, thereby to make up material 132. In this respect material 132 could also be made up of alternating strips or other shaped areas of coating material and dopant respectively, rather than using a homogeneous admixture thereof.

Anodes 124a and 124b are T-shaped bars of stainless steel. Anodes 124a and 124b are supported by electrically insulative support members 152 in an inverted position. Each anode 124a and 124b is operatively associated with the corresponding cathode target 122a and 122b and control electronics 146a and 146b.

In addition to significantly reducing or eliminating the problem of instabilities due to a nonconductive coating covering the anode, a cathode target comprising a second element in admixture with an element such as silicon is itself more stable. The addition of another element, such as, for example, chromium, hafnium, titanium or zirconium or any of the other elements previously described for the dopant, to a cathode target comprising a large proportion of silicon (or other brittle material) makes the silicon more ductile and therefore less susceptible to cracking and flaking due to expansion under heating which occurs during sputter coating. This is yet another advantage of the subject invention.

EXAMPLE

A coating of silicon nitride is applied as part of a layer system for architectural or automotive glass use. Typically, two or more layers of $Si_2N_4$ of between about 100 Å to 500 Å may be interposed with other desirable coatings within the coating system. Such a coating system is applied in a G-49 Airco machine as the glass substrates are sequentially passed through a series of chambers in the machine. This example describes the formation of one such silicon nitride layer.

With reference to FIGS. 5, 6 and 7, a preferred cathode target 122 is a cylindrical type similar to the C-MAG ™ and suitable for use in the Airco G-49 machine. Cathode target 122 comprises coating material 132 adhered to backing tube 134. Backing tube 134, typically made of stainless steel, provides support for material 132.

Material 132 comprises a homogeneous mixture of silicon as the coating component and titanium as the dopant component. In particular, material 132 includes about 5% by weight of titanium as dopant with the balance being substantially all silicon.

For purposes of this invention, the cylindrical rotatable DC magnetron cathode targets 122 are preferably produced by plasma spray techniques and are available from the Vanderstraeten Corp. of Belgium. While cathode target 122 may be produced by other well known methods such as extruding, casting, liquid metal spraying, hot isostatic pressing or electroplating, plasma spraying is preferred because targets of substantially uniform composition are produced at modest cost.

The vacuum chamber bay or zone of the G-49 machine in which the silicon nitride/titanium nitride layer is applied by sputter coating is evacuated initially to the range of about $10^{-6}$ or $10^{-7}$ Torr. With the vacuum pumps running continuously throughout the coating process, a continuous flow of inert background gas and reactive gas is introduced into the chamber. A vacuum pressure of about $2 \times 10^{-3}$ Torr is maintained with a total gas flow of about 2500 sccm comprising about 20% argon and about 80% nitrogen. The purity of the argon and nitrogen gases is about 99.99%.

Prior to the first piece of float glass entering the vacuum chamber, sputter coating is started with the cathode target at about −425 volts and 95 amps. The anode is maintained at about −50 volts and the chamber walls are maintained at ground. Glass sheets are continuously fed through the vacuum chamber at about 345 inches per minute. A coating 156 comprising about 5% by weight of titanium nitride and the balance being substantially all silicon nitride and having a thickness of about 100 Å is applied to float glass substrate 126.

Simultaneously, a coating having the same constituent proportions coats anodes 124a and 124b and chamber walls 144. This coating is sufficiently electrically conductive that anode reconditioning is not required to maintain process efficiencies and coating uniformity before the cathode target needs to be replaced.

Coating 156 retains the characteristics desired of the silicon nitride layer and the overall layer system on the glass despite the presence of titanium nitride. Such characteristics, depending on the ultimate layer system produced may include the achievement of certain levels of solar management properties, heat treatability, mechanical durability and chemical resistance. Once given the above disclosure, many other modifications, features or improvements will become apparent to the skilled artisan. Such other features, modifications and improvements are thus considered a part of this invention, the scope of which is to be determined by the following claims.

We claim:

1. In an apparatus for sputter-coating a layer coating comprised of a metal or a reaction product thereof onto a substrate, said coating being required to meet certain physical characteristics determined prior to sputter-coating, said apparatus including a depletable cathode target system and an anode, said anode being so located such that said layer coating is deposited onto both said substrate and said anode during said sputter-coating, said cathode target system being comprised of a metal coating component and said metal coating component being of such a nature that said coating layer formed therefrom or a reaction product thereof will be sufficiently electrically non-conductive to render said anode inoperative at a time significantly prior to said cathode target system becoming operatively depleted, the improvement comprising wherein said cathode target system is further comprised of a dopant component which by itself or its reactive product, after being sputter-coated onto said anode, is substantially electrically conductive and is in an amount sufficient and so located such that the resulting layer coating formed on said anode is sufficiently electrically conductive so as to maintain said anode operative until said time said cathode target system becomes substantially operatively depleted and wherein said resulting layer coating formed on said substrate meets the said certain physical characteristics determined prior to sputter-coating.

2. An apparatus according to claim 1, wherein said layer coating on said anode has a resistivity of at least about 1 megohm per square until said cathode target system is substantially operatively depleted.

3. The apparatus of claim 2 wherein said dopant component is in an amount less than the amount of said coating component.

4. The apparatus of claim 3 wherein said target includes about 0.1%–20% by weight of said dopant component, the remainder being substantially all coating component.

5. The apparatus of claim 4 wherein said target consists essentially of by weight about 95% coating component and about 5% by weight dopant component.

6. The apparatus of claim 5 wherein said coating component is selected from the group consisting of silicon, aluminum, boron, bismuth, germanium, vanadium, tin, zinc, titanium, zirconium, chromium and tungsten.

7. The apparatus of claim 6 wherein said dopant component is selected from the group consisting of silver, gold, platinum and mixtures thereof.

8. The apparatus of claim 6 wherein said dopant component is a oxidation resistant metal.

9. The apparatus of claim 8 wherein said dopant component is selected from the group consisting of nickel, palladium and mixtures thereof.

10. The apparatus of claim 6 wherein said dopant component is one whose oxides are substantially electrically conductive.

11. The apparatus of claim 10 wherein said dopant component is selected from the group consisting of indium, tin and mixtures thereof.

12. The apparatus of claim 6 wherein said dopant component is one whose nitrides are substantially electrically conductive.

13. The apparatus of claim 12 wherein said dopant component is selected from the group consisting of chromium, hafnium, titanium, zirconium and mixtures thereof.

14. The apparatus of claim 2 wherein said coating and dopant components are combined in a uniform mixture.

15. The apparatus of claim 2 wherein said coating and dopant components are separate, contiguously attached elements of said target.

16. The apparatus of claim 15 wherein said dopant component and said coating component of said target are so located with respect to each other, said anode and said substrate to be coated so as to minimize the amount of dopant component sputtered onto said substrate and maximize the amount of said dopant component sputtered onto said anode while maximizing the amount of said coating component sputtered onto said substrate while minimizing the amount of said coating component sputtered onto said anode.

17. In a method for sputter-coating a layer coating comprised of a metal or a reaction product thereof onto a substrate, said coating being required to meet certain physical characteristics determined prior to sputter-coating, said method including: providing a depletable cathode target system which includes a metal coating component, said metal coating component being of such a nature that said coating layer formed therefrom or a reaction product thereof will be sufficiently electrically non-conductive to render said anode inoperative at a time significantly prior to said cathode target system becoming operatively depleted; providing an anode; locating said anode in a position such that said layer coating will be deposited onto both said substrate and said anode during said sputter-coating and sputter-coating said layer coating onto said substrate and said anode, the improvement comprising: including in said cathode target system a dopant component which by itself or its reaction product, after being sputter-coated onto said anode, is substantially sufficient and so located such that the resulting layer coating formed on said anode is sufficiently electrically conductive so as to maintain said anode operative until said time said cathode target system becomes substantially operatively depleted and wherein said resulting layer coating formed on said substrate meets the said certain physical characteristics determined prior to sputter-coating; and sputter-coating said dopant component as well as said metal coating component onto said substrate and said anode whereby the resulting layer coating formed on said substrate meets the said certain physical characteristics determined prior to said sputter-coating and the resulting coating on said anode remains operatively electrically conductive until said cathode target system is substantially operatively depleted.

18. A method according to claim 17, wherein the resulting coating on said anode maintains a resistivity of at least about 1 megohm per square until said cathode target system is substantially operatively depleted.

19. The method of claim 18 further comprising the step of:
providing a source of a reactive gas thereby producing a coating which is the reactive product of the coating and dopant components.

20. A method according to claim 19 wherein said target includes about 0.1%–20% by weight of said dopant component, the remainder being substantially all coating component.

21. A method according to claim 20 wherein said target consists essentially by weight of about 95% coating component and about 5% by weight dopant component.

22. A method according to claim 20 wherein said coating component is silicon and said dopant component is titanium.

23. A method according to claim 22 wherein said dopant and coating component are in the form of a substantially homogeneous mixture thereof.

* * * * *